(12) United States Patent
Basappa et al.

(10) Patent No.: US 7,916,048 B2
(45) Date of Patent: Mar. 29, 2011

(54) ENCODING A GRAY CODE SEQUENCE FOR AN ODD LENGTH SEQUENCE

(75) Inventors: Jayashri A. Basappa, Bangalore (IN); Anil Pothireddy, Bangalore (IN); David G. Wheeler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/699,153

(22) Filed: Feb. 3, 2010

(65) Prior Publication Data

US 2010/0134332 A1    Jun. 3, 2010

Related U.S. Application Data

(63) Continuation-in-part of application No. 12/127,179, filed on May 27, 2008, now Pat. No. 7,667,629.

(51) Int. Cl.
 *H03M 7/16* (2006.01)
(52) U.S. Cl. ............ 341/98; 375/242; 370/395.62; 365/221; 711/217; 377/108
(58) Field of Classification Search .......... 341/50–98; 370/395.62, 465, 516; 377/34, 40, 26, 33, 377/108, 105, 111; 365/221, 189.07; 375/242, 375/371, 256; 711/217, 218
See application file for complete search history.

(56) References Cited

U.S. PATENT DOCUMENTS

| | | | | |
|---|---|---|---|---|
| 4,618,849 A | * | 10/1986 | Bruestle | 341/98 |
| 5,097,491 A | | 3/1992 | Hall | |
| 5,164,968 A | | 11/1992 | Otto | |
| 5,426,756 A | | 6/1995 | Shyi et al. | |
| 5,448,606 A | | 9/1995 | Snelgrove | |
| 5,734,342 A | * | 3/1998 | Mes | 341/159 |
| 5,754,614 A | | 5/1998 | Wingen | |
| 6,157,328 A | * | 12/2000 | Lu et al. | 341/67 |
| 6,703,950 B2 | * | 3/2004 | Yi | 341/97 |
| 6,762,701 B2 | * | 7/2004 | Jiang | 341/98 |
| 6,836,525 B1 | | 12/2004 | Weng | |
| 6,876,316 B1 | * | 4/2005 | Wu | 341/98 |
| 6,894,953 B2 | * | 5/2005 | Otto | 368/113 |
| 6,900,745 B2 | * | 5/2005 | Jiang | 341/98 |
| 6,907,098 B2 | * | 6/2005 | Nakamura | 377/34 |

* cited by examiner

*Primary Examiner* — Barnie Rexford
*Assistant Examiner* — Lam T Mai
(74) *Attorney, Agent, or Firm* — Stanley Ferrence; Grant A. Johnson

(57) ABSTRACT

A method an apparatus is provided to generate a gray code sequence from a sequence of binary values having a length "L". Accordingly, one aspect of the present invention provides a circuit comprising a cycle flag toggle circuit configured to toggle a cycle flag between a first value and a second value, an intermediate value generator coupled to an output of the cycle flag toggle circuit configured to receive the binary value, and configured to generate an intermediate value from the cycle flag and the binary value, and a binary to gray converter coupled to an output of the intermediate value generator, configured to convert the intermediate value to a gray code.

12 Claims, 5 Drawing Sheets

ENCODING A GRAY CODE SEQUENCE FOR AN ODD LENGTH SEQUENCE

This application is a continuation-in-part of co-pending U.S. patent application Ser. No. 12/127,179, filed May 27, 2008, titled "Generating a gray code for an odd length sequence using a virtual space", the contents of which are incorporated in entirety by reference.

BACKGROUND

Embodiments of the invention relates generally to the field of computer systems, and more particularly to digital encoding.

A Gray code is a binary code in which sequential numbers of the code differ by only one bit. For example, each sequential number in the following Gray code sequence differs by one bit 00, 01, 11, 10.

Because a Gray code sequence has the property that sequential numbers of the code differ by only one bit, a Gray code is very useful in many digital circuits. For example, Gray codes are often used in a computer system to address sequential memory, resulting in less power usage and simplified error correction of the addresses. Gray codes are also used in circuits involving multiple clock domains, for example—for FIFOs used as buffers, and the storage of pixels in digital imagery systems such as high definition televisions, digital cameras, and the like.

A Gray code sequence is comprised of Gray codes. Table 1 illustrates the binary numbers 00 through 11 and their corresponding Gray codes.

TABLE 1

Gray codes for binary numbers 00-11

| Binary Code | Gray Code |
| --- | --- |
| 00 | 00 |
| 01 | 01 |
| 10 | 11 |
| 11 | 10 |

Note that the property that each sequential number of a Gray code sequence differs by only one bit applies also to a transition from the last number of a Gray code sequence back to the first number of the sequence. Table 1 is an example of such a Gray code sequence, where the transition from the last Gray code in the sequence ("10") differs by only one bit from the first number in the sequence ("00").

The application of Gray codes work well for sequences having a length "L" which can be expressed as a power of 2. For example, Table 1 illustrates a Gray code sequence for a sequence of length ("L") equal to 4. In sequences were L is as a power of 2, the Gray code sequence exhibits the property that the last number in the sequence and the first number in the sequence differ by only one bit.

For sequences having a length which is an odd positive integer and utilizing traditional methods and apparatus of generating Gray code sequences, the resulting Gray code sequence will not have sequential Gray codes which differ by only one bit. Thus, for binary sequences of an odd length, the corresponding Gray code sequence cannot transition from the last Gray code to the first Gray code and still maintain the Gray code property for the transition.

What is needed, then, is a method and apparatus to generate a Gray code sequence for "L" binary values, where "L" is an odd positive integer.

SUMMARY

A method and apparatus is provided to generate a gray code sequence from a sequence of binary values having a length "L". Accordingly, one aspect of the invention provides a circuit comprising a cycle flag toggle circuit configured to toggle a cycle flag between a first value and a second value, an intermediate value generator coupled to an output of the cycle flag toggle circuit configured to receive the binary value, and configured to generate an intermediate value from the cycle flag and the binary value, and a binary to gray converter coupled to an output of the intermediate value generator, configured to convert the intermediate value to a gray code.

A further aspect of the invention provides a method, where "L" binary values are received, "L" is an odd positive integer, and each is converted into a gray code, providing a gray code sequence for the binary sequence. For each binary value, an intermediate value is generated from a cycle flag and the binary value and converted into the gray code corresponding to the intermediate value.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

Embodiments of the invention may be better understood, and its numerous objects, features and advantages made apparent to those skilled in the art by referencing the accompanying drawings. The use of the same reference number throughout the several figures designates a like or similar element.

DETAILED DESCRIPTION

Embodiments of the invention are set forth a detailed description for carrying out the one or more devices and/or processes described herein. The description is intended to be illustrative and should not be taken to be limiting.

Embodiments of the invention provides a method and apparatus for generating a Gray code sequence for "L" binary values, where "L" is an odd positive integer. The generation is accomplished by first creating a unique sequence of intermediate values, each of which corresponds to one of the input binary values. Once the intermediate values have been determined, the corresponding Gray code for each of the intermediate values is determined and the resulting sequence is a Gray code sequence.

Figure 1:
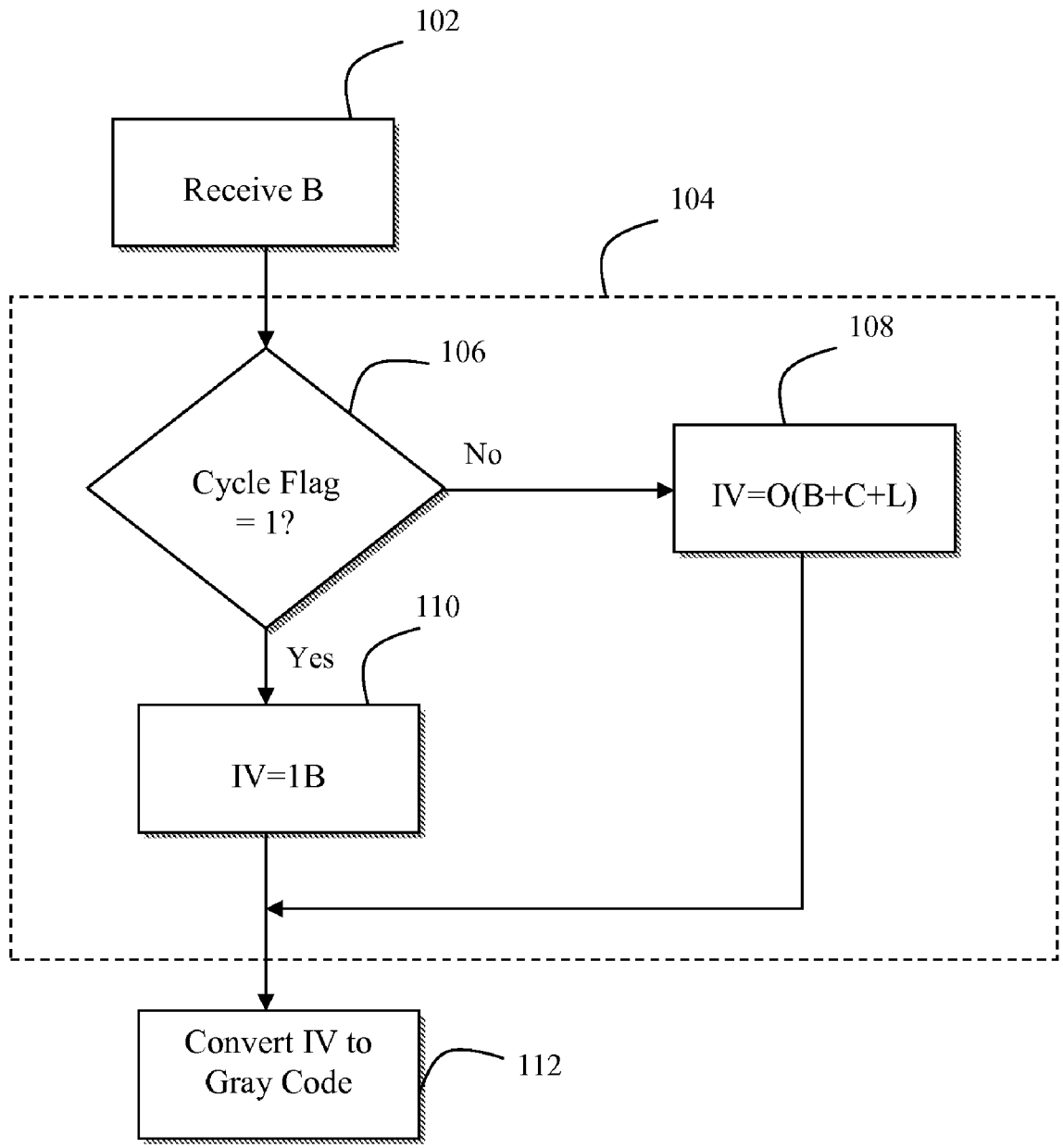
FIG. 1 illustrates an exemplary method to generate a Gray code sequence for "L" binary values, where "L" is an odd positive integer.

FIG. 1 illustrates an exemplary method 100 to generate a Gray code sequence for "L" binary values, where "L" is an odd positive integer. Initially a binary value "B" is received, step 102. Next, an intermediate value "IV" is generated from the binary value "B", step 104.

In generating the intermediate value "IV", a cycle flag is evaluated to determine which cycle of the binary sequence the binary value corresponds, decision block 106. If the cycle flag indicates a first cycle (for example, if the value of the cycle flag is "1" in the presently described embodiment), "YES" branch of decision block 106, then the most significant bit of the intermediate value is set to the value of the cycle flag indicating a first cycle, and the remaining bits of the intermediate value are set to the value of "B", step 110.

If the cycle indicates a second cycle (for example, if the value of the cycle flag is "0" in the presently described embodiment) "NO" branch of decision block 106, then the most significant bit of the intermediate value is set to the value of the cycle flag indicating a second cycle, and the remaining bits of the intermediate value are set to (B+C−L), where "C" is 2 raised to the n power, where n is the number of bits in "B", and where "L" is the desired length of the sequence (for example, for a binary sequence of length 11, there are 11 binary values in the sequence and "L"=11), step 108.

At this point (either step 110 or step 108) an intermediate value is produced. The intermediate value is then converted to its corresponding Gray code, step 112.

Figure 2:
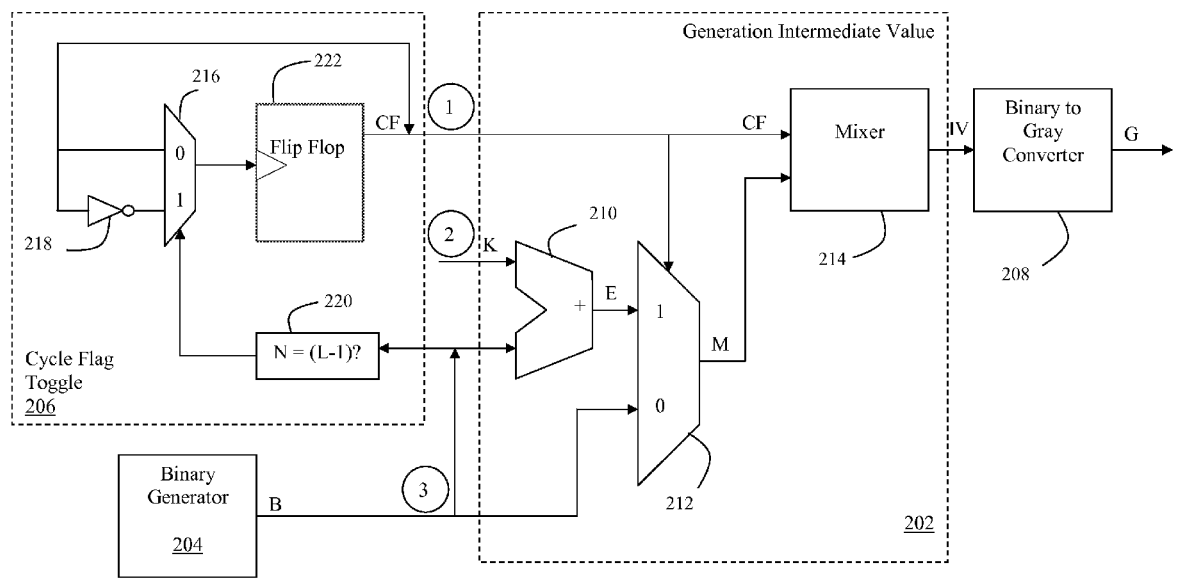
FIG. 2 illustrates an exemplary apparatus to generate a Gray code sequence for "L" binary values, where "L" is an odd positive integer.

FIG. 2 illustrates an exemplary apparatus 200 to generate a Gray code sequence for "L" binary values, where "L" is an odd positive integer. Apparatus 200 includes an intermediate value generator 202 coupled to a binary generator 204 representing any general circuit or hardware and/or software system which generates a binary value "B". Apparatus 200 is also coupled to a cycle flag toggle 206. The output of intermediate value generator 202 is coupled to the input of binary to Gray converter 208.

Intermediate value generator 202 includes adder 210 coupled to multiplexer 212 which is coupled to mixer 214. Adder 210 is configured to add B to the value of "C−L", where C is 2 raised to the power of n, where n is the number of bits of "B", and where "L" is the length of the binary sequence. The output ("E") of adder 210 is coupled to one input of 2:1 multiplexer 212, and the value of "B" is coupled is coupled to the other input of 2:1 multiplexer 212. The control line of 2:1 multiplexer 212 is coupled to the output of cycle flag toggle 206. In this way, 2:1 multiplexer outputs either the value of "B" or the value of B+C−L depending on the cycle of the binary sequence.

Mixer 214 produces the intermediate value ("IV") by joining the output value ("M") from 2:1 multiplexer 212 and the value ("CF") of the cycle flag generated from cycle flag toggle 206. The intermediate value is then converted to a Gray code ("G") using a standard binary to Gray code converter 208.

Returning briefly to cycle flag toggle 206, toggle 206 is used to flip a cycle flag for each cycle of the binary sequence of length L. Cycle flag toggle 206 includes a 2:1 multiplexer 216 having inputs 0 and 1 (with inverter 218 coupled to the 0 input). The control line of 2:1 multiplexer 216 is coupled to the output of comparator 220. Comparator 220 compares the current number of binary values processed in the sequence to "L−1". In this way, comparator 220 can signal whether a new cycle is beginning. For example, if the value of "L" is 11 and N is 12, then the comparator signals that a new sequence has begun. In otherwords, the cycle flag transitions each time L binary values have been processed. This signal will select the corresponding value from 2:1 multiplexer 216 which is then output to flip flop 222 to toggle the cycle flag between a first value (e.g., logic "1") and a second value (e.g., logic "0").

Figure 3:
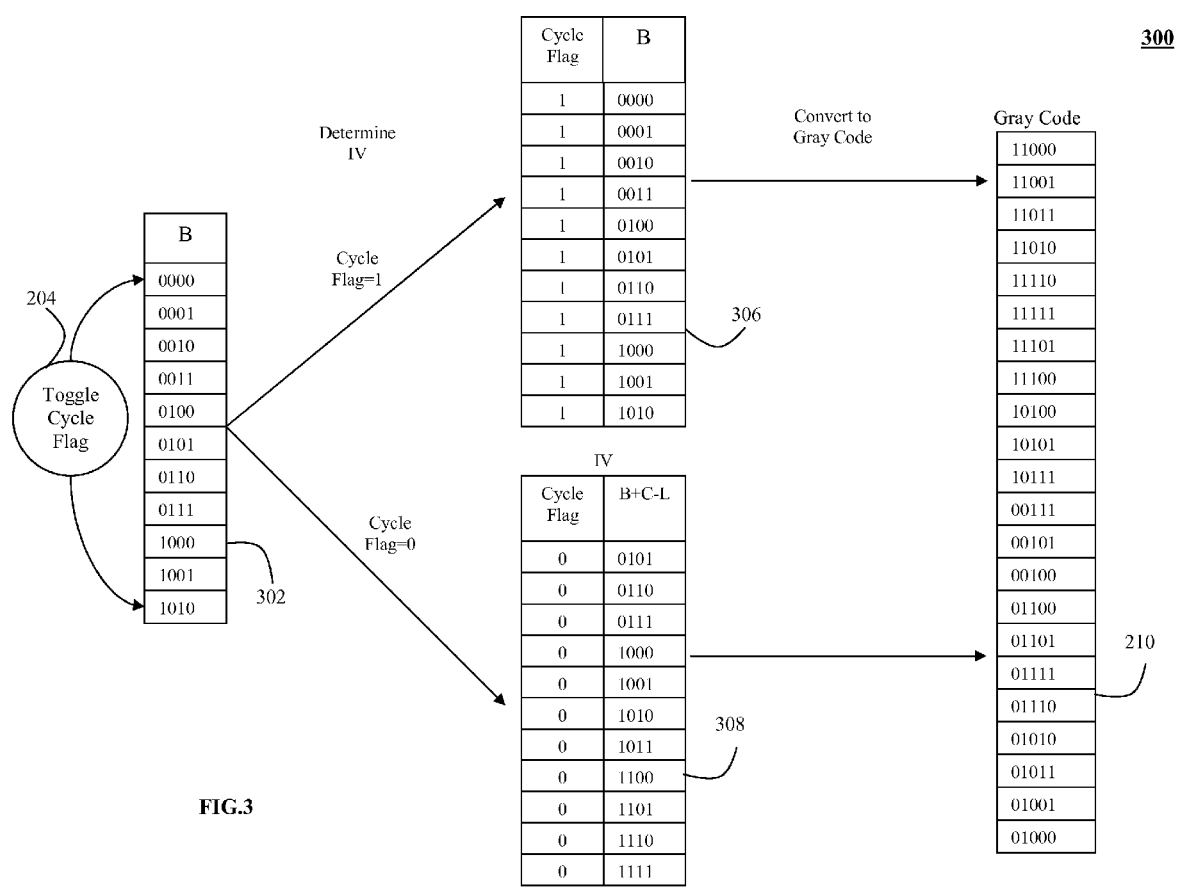
FIG. 3 illustrates en example of generating a Gray code sequence for 11 binary values, using the method and apparatus of FIGS. 1 and 2.

FIG. 3 illustrates an example of generating a Gray code sequence for eleven (11) binary values (noting that L is equal to 11, an odd positive integer), using the method and apparatus of FIGS. 1 and 2. Column 302 contains 11 consecutive binary values 0 through 1010. It is desirable to generate a corresponding Gray code sequence for the binary sequence in column 302.

In the presently described embodiment, the value of the cycle flag is initialized to logic "1". Accordingly for the first iteration from the values of 0000 through 1010, the intermediate values shown in column 306 are produced, by for example apparatus 200. In this presently described cycle, the most significant bit of the intermediate value is set to the value of the cycle flag ("1") and the remaining bits of the intermediate value are set to the value of B.

Referring back to column 302, upon transitioning from the last value in the binary sequence (1010) back to the first value of the binary sequence (0000), the cycle flag is toggled (by for example cycle flag toggle 206). In the presently described example, the cycle flag is toggled to logic "0". Upon this cycle through the binary values 0000 through 1010, the intermediate values produced are those shown in column 308. More specifically, the most significant bit of the intermediate value is set to the value of the cycle flag ("0") and the remaining bits of the intermediate value are set to B+C−L.

Referring back to column 302, upon transitioning from the last value in the binary sequence (1010) back to the first value of the binary sequence (0000), the cycle flag is again toggled. In the presently described example, the cycle flag is toggled to 1. Upon this cycle through the binary values 0000 through 1010, the intermediate values produced are those shown in column 306. Thus cycle repeats as the cycle through the binary values repeats.

Column 310 illustrates the Gray codes which correspond to the intermediate values shown in columns 306 and 308. Rows 1 through 11 of column 310 contain the Gray codes for rows 1 through 11 of column 306. Rows 12 through 22 of column 310 contain the Gray codes for rows 1 through 11 of column 308. Notice that the Gray codes in column 310 have the property that each code differs by only one bit, and further that the last value of the sequence and the first value of the sequence also differ by only one bit. Thus method 100 and apparatus 200 have generated a Gray code sequence for a binary sequence having a length of L, where L is an odd positive integer.

Figure 4:
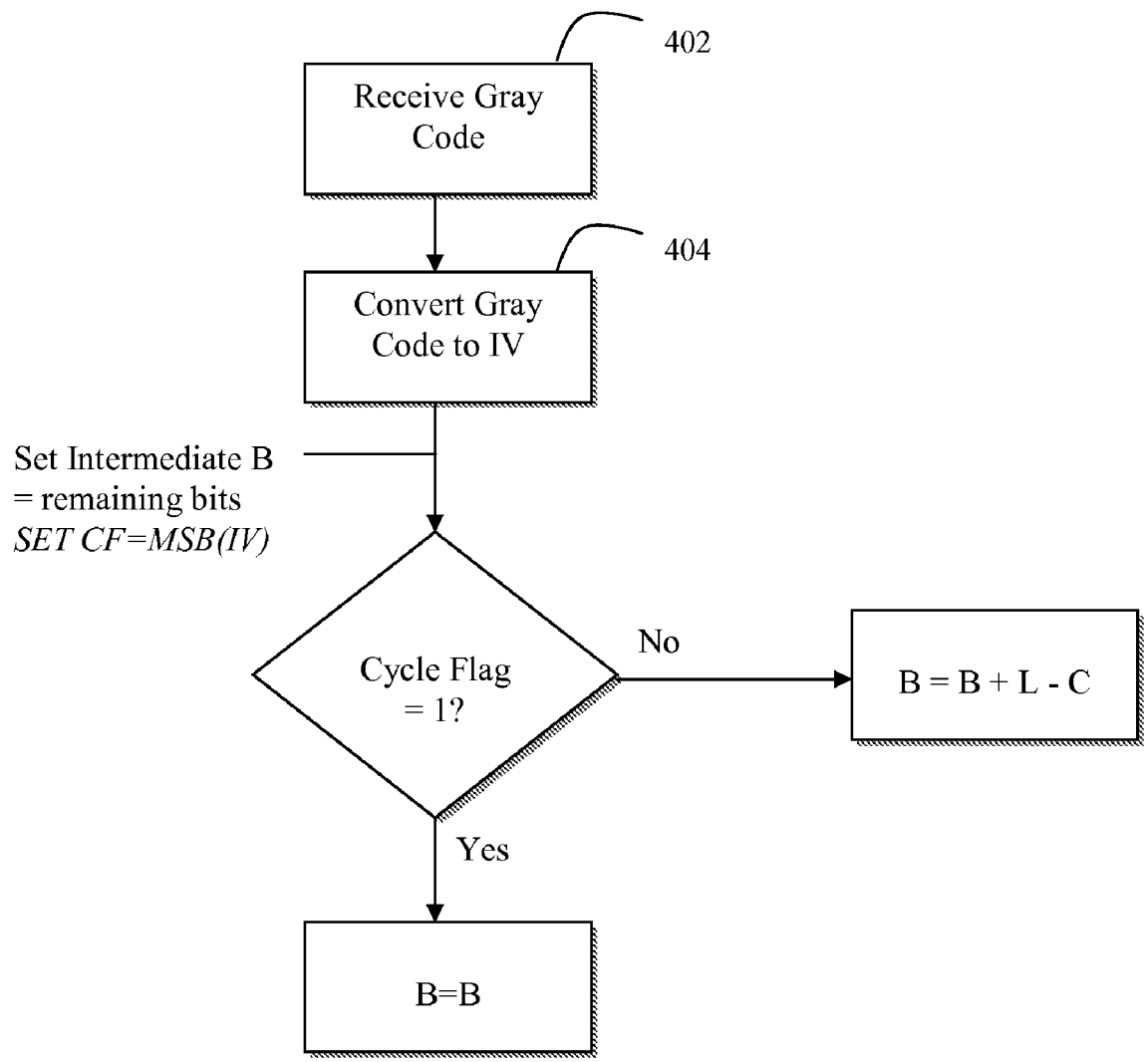
FIG. 4 is an exemplary method to decode a Gray code sequence into "L" binary values.

FIG. 4 is an exemplary method to decode a Gray code sequence into "L" binary value. In step 402, a Gray code is received. Upon receipt of the Gray code, the Gray code is converted to the intermediate value, step 404. Next, the value of cycle flag is set equal to the most significant bit of the intermediate value and the most significant bit of the intermediate value is stripped off the intermediate value and a value of intermediate B is set equal to the remaining bits of the intermediate value. If the most significant bit of the intermediate value is 1 ("YES" branch of decision block 406), then the value of B is equal the value of intermediate B, step 410. If the most significant bit of the intermediate value is 0 ("NO"

branch of decision block 406), then the value of B is the value of intermediate B plus L minus C where L is the length of the binary sequence and C is 2 raised to the power of n, where n is the number of bits in B, step 408.

Figure 5:
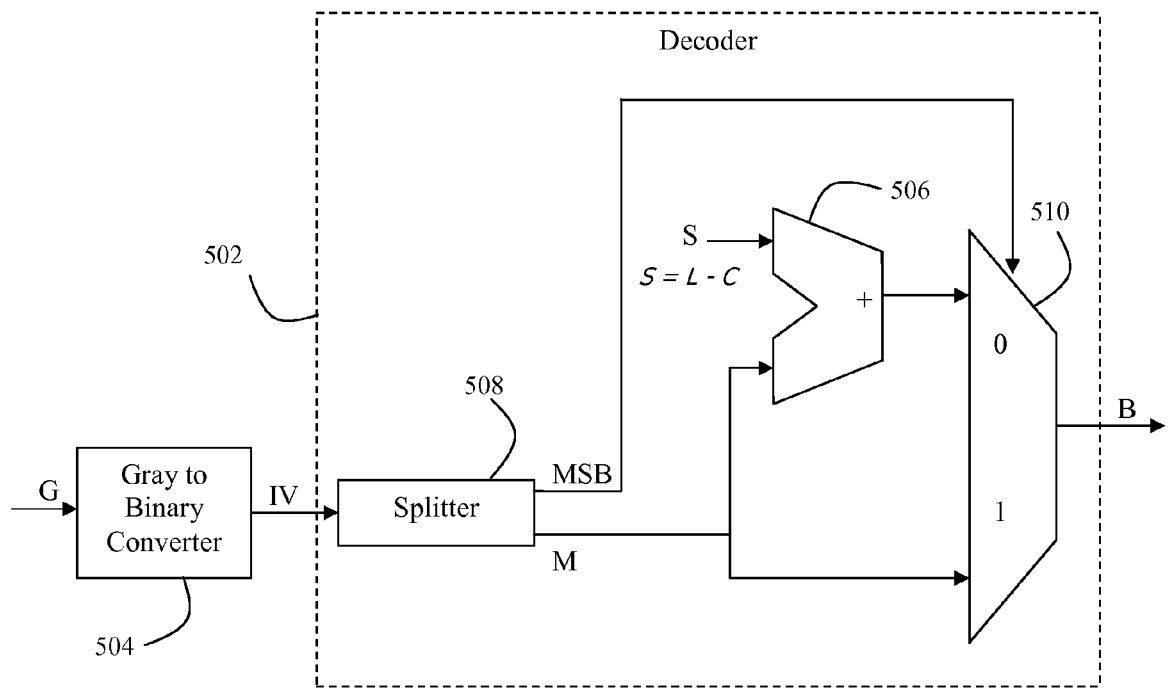
FIG. 5 illustrates an exemplary apparatus to decode a Gray code sequence for "L" binary values, where "L" is an odd positive integer.

FIG. 5 illustrates an exemplary gray decoder 500 to decode a Gray code sequence for "L" binary values, where "L" is an odd positive integer. Gray decoder 500 includes decoder 502 coupled to Gray code to binary converter 504. Gray code 504 can be a standard Gray code to binary converter which converts a Gray code to its binary equivalent. Decoder 502 includes an adder 506 coupled to a splitter 508 and a 2:1 multiplexer 510. Splitter 508 splits the most significant bit (e.g., the cycle flag) from the intermediate value ("IV"). This output ("MSB"), the most significant bit of the intermediate value, is coupled to the control line of 2:1 multiplexer 510. Adder 506 adds the remaining bits of the intermediate value (M) to L minus C, where L is the length of the binary sequence and C is 2 raised to the power of n, where n is the number of bits in the original binary value B. The output of adder is input into 2:1 multiplexer 510, and the remaining bits of the intermediate value (e.g., all bits but the most significant bit) are input into the 2:1 multiplexer 510. Depending on the value of the cycle flag, the value of "B" is produced, or the value of M+L−C is output from 2:1 multiplexer 510. Decoder 502 converts the intermediate value to the original binary value of a sequence (for example a binary sequence which was input into Apparatus 200).

Figure 6:
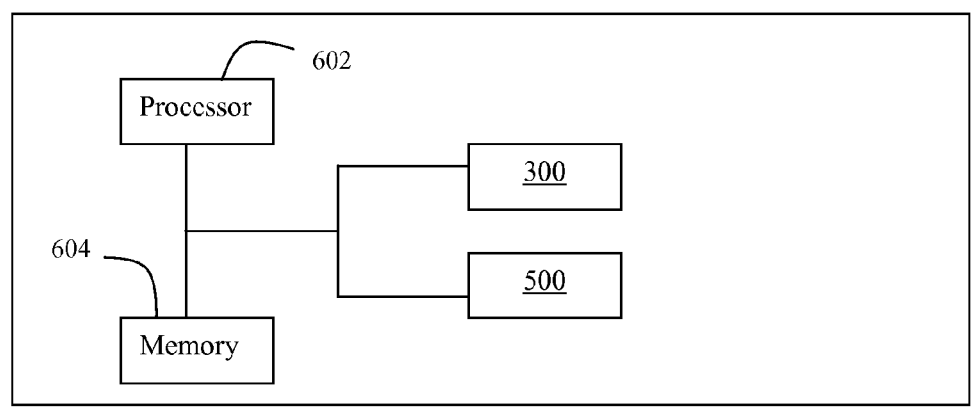
FIG. 6 illustrates an exemplary computer system capable of encoding and decoding a Gray code sequence for "L" binary values, where "L" is an odd positive integer as illustrated in FIG. 5.

FIG. 6 illustrates a system 600 including a processor 602 coupled to a memory 604. Processor 602 is also coupled to apparatus 300 and apparatus 500, and in this way, system 600 is configured to operate on a gray code sequence generated from a sequence of binary values of length "L", where "L" is an odd positive integer. In one embodiment of the present invention, system 600 is a clock-domain circuit. In another embodiment of the present invention, system 600 is a high definition television. In yet another embodiment of the present invention, system 600 is a digital camera. In still another embodiment of the present invention, system 600 is a computer system.

Regarding terminology used herein, it will be appreciated by one skilled in the art that any of several expressions may be equally well used when describing the operation of a circuit including the various signals, nodes, and components within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although embodiments of the invention has been described with respect to a specific preferred embodiment thereof, various changes and modifications may be suggested to one skilled in the art and it is intended that the disclosure encompass such changes and modifications that fall within the scope of the appended claims.

What is claimed is:

1. A method for generating a gray code from a binary value, the method comprising:
   receiving a binary value from a binary generator and a cycle flag from a cycle toggle;
   generating an intermediate value from the cycle flag and the binary value; and
   converting the intermediate value into the gray code corresponding to the intermediate value with a gray converter.

2. The method as claimed in claim 1, further comprising:
   receiving L binary values, where L is an odd positive integer; and
   generating a gray code sequence from the L binary values.

3. A method for generating a gray code from a binary value, the method comprising:
   generating an intermediate value from a cycle flag and the binary value:
   setting the most significant bit of the intermediate value equal to the cycle flag, and setting the remaining bits of the intermediate value equal to the binary value; and
   converting the intermediate value into the gray code corresponding to the intermediate value.

4. The method as claimed in claim 3, wherein the most significant bit of the intermediate value is set equal to the cycle flag and the remaining bits of the intermediate value are set equal to the binary value if the cycle flag is equal to a first value.

5. The method as claimed in claim 4, wherein the significant bit is set equal to "1".

6. A method for generating a gray code from a binary value, the method comprising:
   receiving L binary values, where L is an odd positive integer;
   generating an intermediate value from a cycle flag and the L binary values;
   setting the most significant bit of the intermediate value equal to the cycle flag, and setting the remaining bits of the intermediate value equal to (B+C−L), where B is the binary value, where C is 2 raised to the n power, where n is the number of bits in B; and
   converting the intermediate value into the gray code corresponding to the intermediate value.

7. The method as claimed in claim 6, wherein the most significant bit of the intermediate value is set equal to logic "0".

8. An apparatus for generating a gray code from a binary value comprising a cycle flag toggle circuit configured to toggle a cycle flag between a first value and a second value; an intermediate value generator coupled to an output of the cycle flag toggle circuit configured to receive the binary value, and configured to generate an intermediate value from the cycle flag and the binary value; and a binary to gray converter coupled to an output of the intermediate value generator, configured to convert the intermediate value to a gray code.

9. An apparatus for generating a gray code from a binary value comprising; a cycle flag toggle circuit configured to toggle a cycle flag between a first value and a second value; an intermediate value generator coupled to an output of the cycle flag toggle circuit configured to receive the binary value, and configured to generate an intermediate value from the cycle flag and the binary value; and a binary to gray converter coupled to an output of the intermediate value generator, configured to convert the intermediate value to a gray code;
   wherein the cycle flag toggle circuit comprises a comparator configured to receive the binary value and compare the number of binary values received to a predetermined length of binary values L; a 2:1 multiplexer having a first input, a second input, and a control line coupled to the output of the comparator; and a flip flop coupled to the output of the 2:1 multiplexer and also coupled to the input of the intermediate value generator.

10. The apparatus as claimed in claim 9, wherein the first input is selected when the control line equals to logic "0".

11. The apparatus as claimed in claim 9, wherein the second input is selected when the control line equals to logic "1".

12. An apparatus for generating a gray code from a binary value comprising a cycle flap toggle circuit configured to toggle a cycle flag between a first value and a second value; an intermediate value generator coupled to an output of the cycle flag toggle circuit configured to receive the binary value, and configured to generate an intermediate value from the cycle flag and the binary value; and a binary to gray converter coupled to an output of the intermediate value generator, configured to convert the intermediate value to a gray code;

wherein the intermediate value generator comprises an adder configured to add the binary value to the value of C minus L, where C is 2 raised to the power of n, where n is the number of bits of the binary value, and where L is the length of the binary sequence; a 2:1 multiplexer having a first input coupled to the output of the adder; a second input configured to receive the binary value, and a control line coupled to the output of the cycle toggle flag circuit; and a mixer having a first input coupled to the output of the multiplexer, a second input coupled to the output of the cycle flag toggle and an output coupled to the binary to gray converter, configured to join the output value from the multiplexer and the output of the cycle toggle flag circuit.

* * * * *